(12) United States Patent
Inose

(10) Patent No.: US 8,138,813 B2
(45) Date of Patent: Mar. 20, 2012

(54) INTERFACE CIRCUIT

(75) Inventor: Hiroshi Inose, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 235 days.

(21) Appl. No.: 12/108,132

(22) Filed: Apr. 23, 2008

(65) Prior Publication Data

US 2008/0265940 A1 Oct. 30, 2008

(30) Foreign Application Priority Data

Apr. 26, 2007 (JP) ................................. 2007-116402

(51) Int. Cl.
*H03L 5/00* (2006.01)
(52) U.S. Cl. .................................. 327/333; 365/189.11
(58) Field of Classification Search .................. 327/333; 326/68, 80, 81; 365/189.11, 230.06
See application file for complete search history.

(56) References Cited

U.S. PATENT DOCUMENTS

| | | | |
|---|---|---|---|
| 5,512,853 A | 4/1996 | Ueno et al. | |
| 5,793,680 A | 8/1998 | Okajima | |
| 6,597,229 B1 | 7/2003 | Koyata et al. | |
| 6,628,564 B1 * | 9/2003 | Takita et al. | 365/230.06 |
| 6,784,718 B2 | 8/2004 | Okamoto et al. | |
| 2002/0163365 A1 | 11/2002 | Jung | |
| 2003/0080795 A1 | 5/2003 | Okamoto et al. | |
| 2004/0013021 A1 | 1/2004 | Takahashi et al. | |
| 2008/0169422 A1 * | 7/2008 | Shahar et al. | 250/370.09 |

FOREIGN PATENT DOCUMENTS

| | | |
|---|---|---|
| CN | 1416138 | 5/2003 |
| JP | 7264042 | 10/1995 |
| JP | 2001-057546 | 2/2001 |
| TW | 483247 | 4/2002 |
| TW | 544935 | 8/2003 |
| TW | I229868 | 3/2005 |

OTHER PUBLICATIONS

TW Office Action dated Dec. 30, 2011, with English Translation.
Pelgrom, M.J.M.; Dijkmans, E.C.; "A 3/5 V Compatible I/O Buffer", Solid-State Circuits, IEEE Journal of, vol. 30, No. 7, pp. 823-825, Jul. 1995.
Culurciello, E.; Andreou, A.G.; "Capacitive Inter-Chip Data and Power Transfer for 3-D VLSI", Circuits and Systems II: Express Briefs, IEEE Transactions on, vol. 53, No. 12, pp. 1348-1352, Dec. 2006.
Mick, S.; Luo, L.; Wilson, J.; Franzon, P.; "Buried Bump and AC Coupled Interconnection Technology", Advanced Packaging, IEEE Transactions on, vol. 27, No. 1, pp. 121-125, Feb. 2004.

* cited by examiner

*Primary Examiner* — Lincoln Donovan
*Assistant Examiner* — Diana J Cheng
(74) *Attorney, Agent, or Firm* — Young & Thompson

(57) ABSTRACT

An interface circuit according to one aspect of the present invention may include a receiving circuit operating on a supply voltage lower than a high-level voltage value of an input binary signal, an input level determination circuit generating an input level determination signal having a frequency higher than a frequency of the binary signal and controls whether to output the input level determination signal or not, based on a voltage level of the binary signal, and an AC coupling element connected between an output terminal of the input level determination circuit and an input terminal of the receiving circuit.

10 Claims, 5 Drawing Sheets

INTERFACE CIRCUIT

BACKGROUND OF THE INVENTION

1. Field of the Invention

The present invention relates to an interface circuit. More specifically, the invention relates to an interface circuit that receives a binary signal through a capacitor.

2. Description of Related Art

Traditionally, when different semiconductor devices are connected, connection of the semiconductor devices through a capacitor has been often performed. The capacitor has a function of passing an AC component of an input signal and blocking a DC component of the input signal. For this reason, by connecting the capacitor in series with a signal line that connects the semiconductor devices having mutually different bias voltages of an AC signal to be handled, a difference between the bias voltages may be eliminated by the capacitor. Japanese Unexamined Patent Application Publication No. 2001-57546 discloses a method of connecting the semiconductor devices using the capacitor as described above.

The capacitor, however, has a characteristic in which a voltage at a terminal of the capacitor connected to a semiconductor device on a receiving side is reduced over timer according to a time constant determined by an input impedance of the semiconductor device on the receiving side and a capacitance value of the capacitor. For this reason, when the semiconductor devices are connected through the capacitor, it is necessary to set the capacitance value of the capacitor and the input impedance of the semiconductor device on the receiving side, according to a frequency of a signal to be handled.

When the frequency of the signal to be handled is extremely low (e.g. when a certain voltage level continues for several hours or longer), the capacitance value of the capacitor or the input impedance of the semiconductor device on the receiving side must be extremely increased. In such a case, the capacitance value of the capacitor and the input impedance of the semiconductor device on the receiving side may be set unfeasibly large.

It has been discovered that, using the technique described in Japanese Unexamined Patent Application Publication No. 2001-57546, it is impossible to normally perform communication between the semiconductor devices using the signal of the extremely low frequency while blocking a DC component of the signal generated between the semiconductor devices.

SUMMARY

An interface circuit according to one aspect of the present invention may include a receiving circuit operating on a supply voltage lower than a high-level voltage value of an input binary signal, an input level determination circuit generating an input level determination signal having a frequency higher than a frequency of the binary signal and controls whether to output the input level determination signal or not, based on a voltage level of the binary signal, and an AC coupling element connected between an output terminal of the input level determination circuit and an input terminal of the receiving circuit.

In the interface circuit of the present invention, the input level determination circuit controls whether to output the input level determination signal or not, based on the voltage level of the binary signal, and the receiving circuit receives the input level determination signal through a capacitor. This allows the receiving circuit to detect the voltage level of the binary signal according to presence or absence of the input level determination signal.

According to the interface circuit of the present invention, communication between semiconductor devices using a signal of an extremely low frequency may be normally performed while blocking a DC component of the signal generated between the semiconductor devices.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
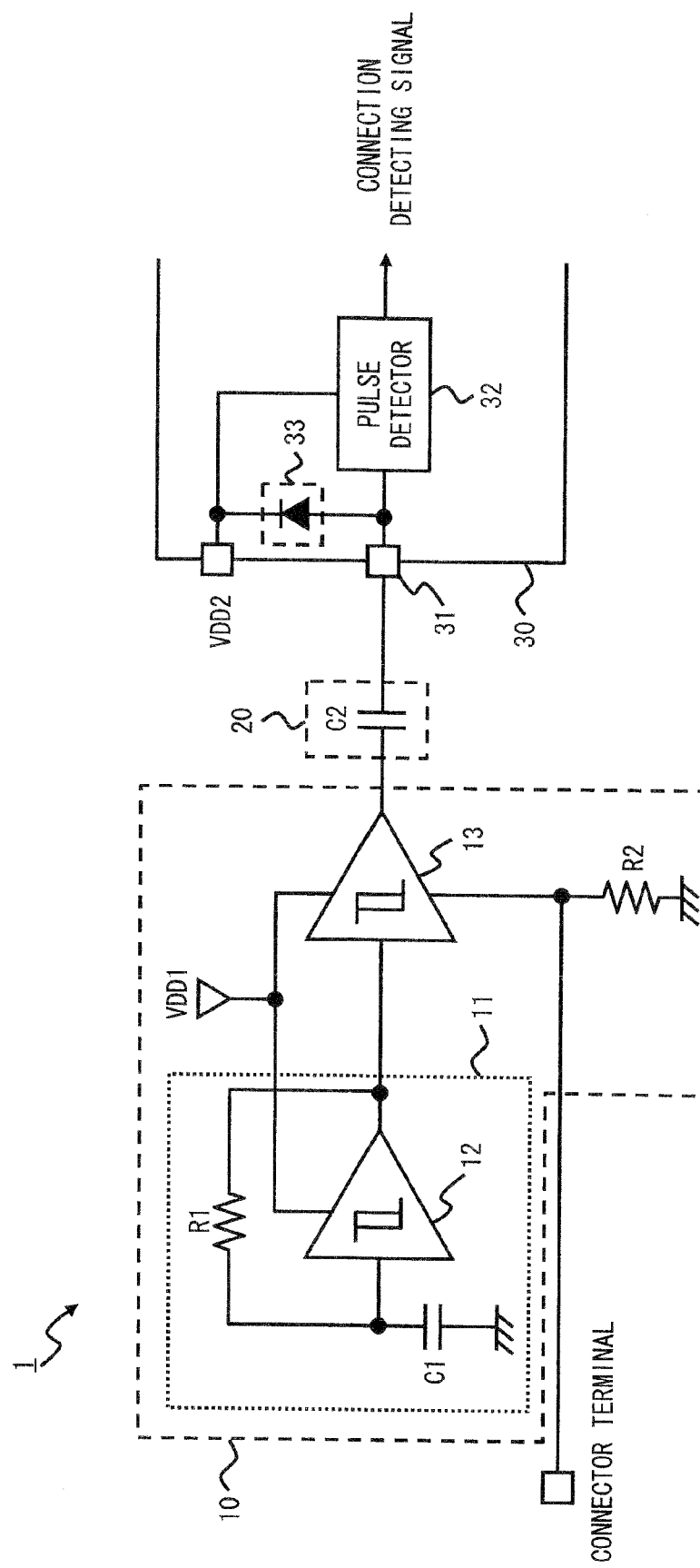
FIG. 1 is a circuit diagram of an interface circuit according to a first embodiment of the present invention.

Embodiments of the present invention will be described below with reference to drawings. A circuit diagram of an interface circuit 1 according to a first embodiment of the present invention is shown in FIG. 1. As shown in FIG. 1, the interface circuit 1 includes an input level determination circuit 10, an AC coupling element 20, and a receiving circuit 30. In this embodiment, the interface circuit 1 is arranged on a board having a connector terminal. The interface circuit 1 detects a voltage level of a binary signal input through the connector terminal. Other device is connected to this connector terminal through a cable. The binary signal is a signal output from the other device connected to the connector terminal to notify a connection state of the other device. When the binary signal is at a first logic level (such as a high voltage level of approximately 5V), for example, it indicates that the other device is in an operation state. On the other hand, when the binary signal is at a second logic level (such as a low voltage level of approximately 0V), it indicates that the other device is in a non-operation state.

The input level determination circuit 10 operates, using the binary signal input to the connector terminal as a control signal, and controls whether to output an input level determination signal or not, according to the voltage level of the binary signal. The input level determination circuit 10 includes an oscillating circuit 11 and an output control circuit 13. The oscillating circuit 11 includes a hysteresis comparator 12, a resistor R1, and a capacitor C1, for example. An output node and an input node of the hysteresis comparator 12 are connected by the resistor R1. The capacitor C1 is connected between the input node and a ground node of the hysteresis comparator 12. With this arrangement, the oscillating circuit 11 outputs an AC signal having a frequency higher than a frequency of the binary signal, as the input level determination signal. The frequency of the input level determination signal may be the one at which the input level determination signal may pass through the capacitor C1 as the AC signal.

The output control circuit 13 includes an enable terminal. A resistor R2 is connected between the enable terminal and a ground node of the output control circuit 13. A connecting point between the enable terminal and the resistor R2 is connected to the connector terminal. The input level determination signal is input to an input node of the output control circuit 13. An output terminal of the output control circuit 13 is connected to the AC coupling element 20. The output control circuit 13 controls whether to output the input level determination signal or not according to a voltage level at the enable terminal.

The oscillating circuit 11 and the output control circuit 13 operate on a first supply voltage supplied from a first power supply node VDD1. This first supply voltage may be equal to or higher than a voltage level when the binary signal is high. In this embodiment, 5V, which is the same voltage level as that when the binary signal is high, is used as the first supply voltage.

The AC coupling element 20 transmits the AC signal. In this embodiment, a capacitor C2 is used as the AC coupling element 20. One terminal of the capacitor C2 is connected to an output node of the input level determination circuit 10 (which is an output node of the output control circuit 13 in this embodiment), and the other terminal of the capacitor C2 is connected to an input node 31 of the receiving circuit 30.

The receiving circuit 30 includes the input node 31, a second power supply node VDD2, a pulse detector 32, and a clamp circuit 33. The pulse detector 32 detects the input level determination signal input through the capacitor C2, and then outputs a connection detecting signal. The pulse detector 32 operates on a second supply voltage supplied from the second power supply node VDD2. The second supply voltage is smaller than the voltage level when the binary signal is high, and is approximately 1.8V in this embodiment. The receiving circuit 30 operates on this second supply voltage. A low level of the connection detecting signal output from the pulse detector 32 is 0V, for example. A high level of the connection detecting signal is the voltage value of the second supply voltage.

The clamp circuit 33 limits a voltage level at the input node 31 so that the voltage level at the input node 31 does not exceed the breakdown voltage of the receiving circuit 30. The clamp circuit 33 is connected between the input node 31 and the second power supply node VDD2. In this embodiment, a protective diode for the receiving circuit 30 (for electrostatic discharge protection, for example) is employed as the clamp circuit 33. An anode of the protective diode is connected to the input node 31, while a cathode of the protective diode is connected to the second power supply node VDD2. This clamp circuit 33 causes the maximum value of the voltage level at the input node 31 to be a sum of the second supply voltage and a forward voltage of the protective diode.

Figure 2:
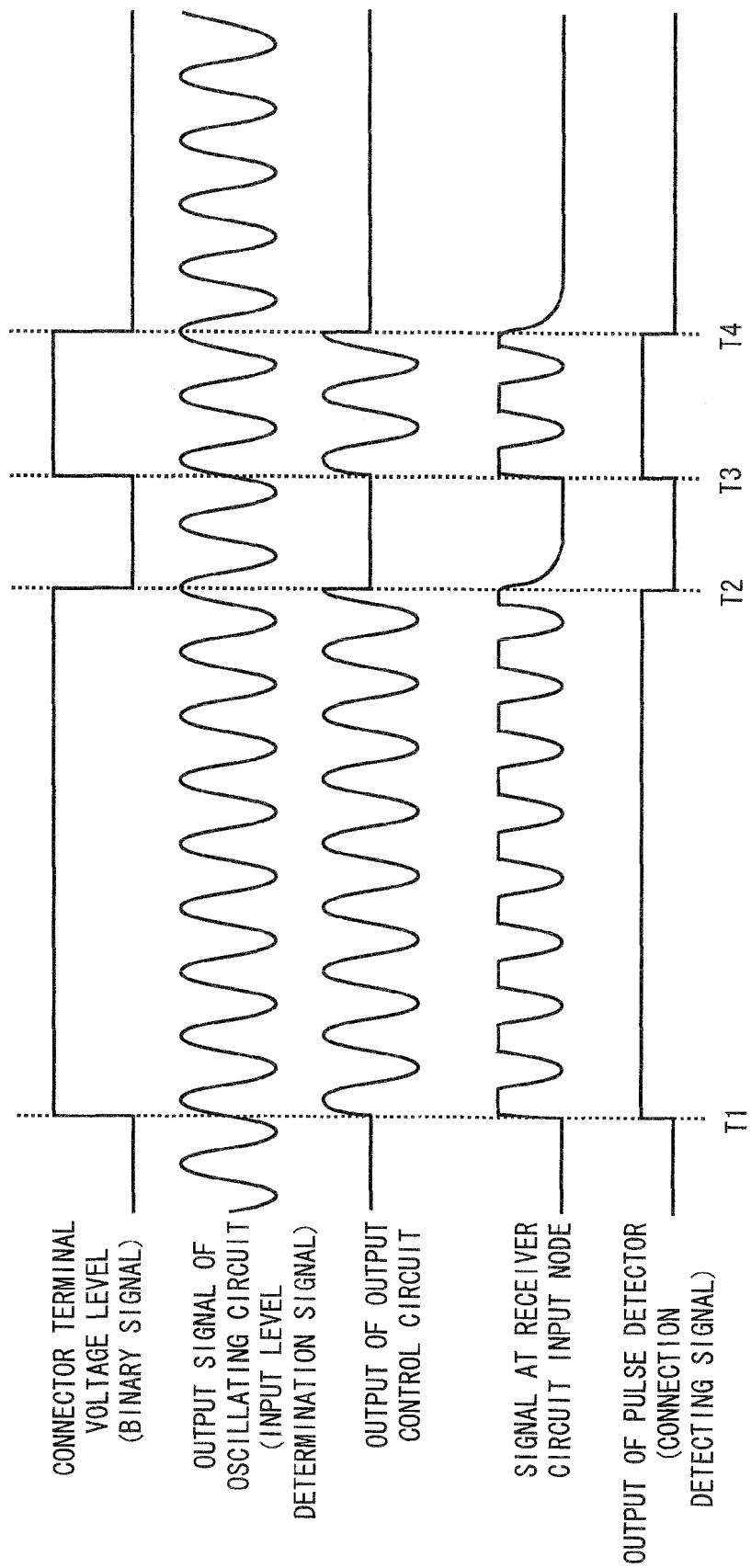
FIG. 2 is a timing chart showing an operation of the interface circuit according to the first embodiment.

Next, a timing chart showing an operation of the interface circuit 1 will be shown in FIG. 2. The operation of the interface circuit according to this embodiment will be described with reference to FIG. 2. As shown in FIG. 2, the oscillating circuit 11 in the interface circuit 1 always outputs the input level determination signal, while being powered on. Then, when the voltage level of the binary signal is switched from low to high at a timing T1, the output control circuit 13 begins to output the input level determination signal. This input level determination signal is supplied to the input node 31 of the receiving circuit 30 through the capacitor C2. At this point, the maximum voltage at the input node 31 is limited by the clamp circuit 33. Thus, the top of a waveform of the input level determination signal at the input node 31 is cut off. The pulse detector 32 detects the input level determination signal at the input node 31, and then switches the connection detecting signal from low to high.

Then, at a timing T2, the binary signal is switched from high to low. According to this switching, the output control circuit 13 stops outputting the input level determination signal. Then, a voltage value at the input node 31 is reduced from the one at the timing T2 at a reduction ratio according to the time constant. Further, the input level determination signal is not supplied to the pulse detector 32. Thus, the pulse detector 32 switches the connection detecting signal from high to low.

The operation of the interface circuit 1 at a timing T3 is the same as that at the timing T1, and the operation of the interface circuit 1 at a timing T4 is the same as that at the timing T2. Thus, a description about the operations at these timings will be omitted. The frequency of the input determination signal shown in FIG. 2 is schematic, and is different from an actual frequency. Actually, there are several hours or more from the timing T1 to the timing T2, for example.

As described above, in the interface circuit 1 in this embodiment, the input level determination circuit 10 outputs the input level determination signal having the high frequency according to the voltage level of the binary signal. The receiving circuit 30 may thereby determine the voltage level of the binary signal based on this input level determination signal.

Using the interface circuit 1 according to this embodiment, the input level determination circuit 10 and the receiving circuit 30 may be connected through the capacitor C2. By connecting the input level determination circuit 10 and the receiving circuit 30 through the capacitor C2, the receiving circuit 30 is electrically isolated from the input level determination circuit 10 or the other device connected through the connector terminal, with respect to DC components. When a device on which the receiving circuit 30 is mounted (hereinafter referred to as a first device) and other device (hereinafter referred to as a second device) operate based on power supplies fed from different outlets, respectively, and when these devices are connected through a cable, for example, ground voltages of the first and second devices may differ. By connecting the first and second devices through the capacitor even in such a case, the first device and the second device may be independently operated, irrespective of a difference between the ground voltages (DC components). Isolation between connected devices with respect to power supplies as described above is referred to as galvanic isolation.

Conventionally, when dealing with a binary signal that has an extremely long period of a change and one of voltage levels thereof is therefore substantially a DC voltage, for example, the first and second devices must be directly connected without using the AC coupling element such as the capacitor. When the first device is operated on the supply voltage lower than a high-level voltage value of the binary signal output from the second device, a high breakdown voltage interface and a voltage converter circuit such as a tolerant buffer and a level shift circuit are necessary for the receiving circuit on the first device. Then, each of the level shift circuit and the tolerant buffer must be formed of a high breakdown voltage element that requires a larger circuit area than other element which forms the receiving circuit.

The receiving circuit 30 of the interface circuit 1 in this embodiment is, however, connected to the input level determination circuit 10 through the AC coupling element 20. Thus, by limiting an amplitude of the signal that has passed through the capacitor, the receiving circuit 30 may be formed of low breakdown voltage elements. The input level determination circuit 10 and the AC coupling element 20 are mounted on the board, together with the receiving circuit 30. The input level determination circuit in this embodiment may be formed of a common TTL (Transistor Transistor Logic) circuit. It means that the input level determination circuit 10 may be formed of devices marketed at a low price. Accordingly, there is scarcely a cost increase due to addition of the input level determination circuit.

The interface circuit 1 in this embodiment is particularly effective in a system compliant with an HDMI (High-Definition Multimedia Interface) standard or a DVI (Digital Visual Interface) standard (hereinafter referred to as the HDMI or the like). In the HDMI or the like, when devices are connected by a cable, a signal indicating connection between the devices is transmitted from one device to the other. This signal is referred to as an HPD (Hot Plug Detect) signal, which maintains high while the devices are connected, and goes low when the devices are disconnected. Further, in recent years, a lower operating voltage is employed for the receiving circuit 30 in order to reduce power consumption.

In this embodiment, by receiving the HPD signal as the binary signal, the receiving circuit 30 may correctly recognize a voltage level of the HPD signal. Further, even when the voltage level (generally 5V) of the HPD signal is higher than the operating voltage of the receiving circuit 30, the receiving circuit 30 receives the input level determination signal generated based on the HPD signal. Thus, a malfunction caused by a difference between the supply voltage for the receiving circuit 30 and the voltage level of the HPD signal may be prevented. Further, the receiving circuit 30 may keep an isolation state from the other device with respect to the DC components of the power supply and the like, by galvanic isolation. This may prevents breakdown and malfunction of the receiving circuit 30.

Second Embodiment

Figure 3:
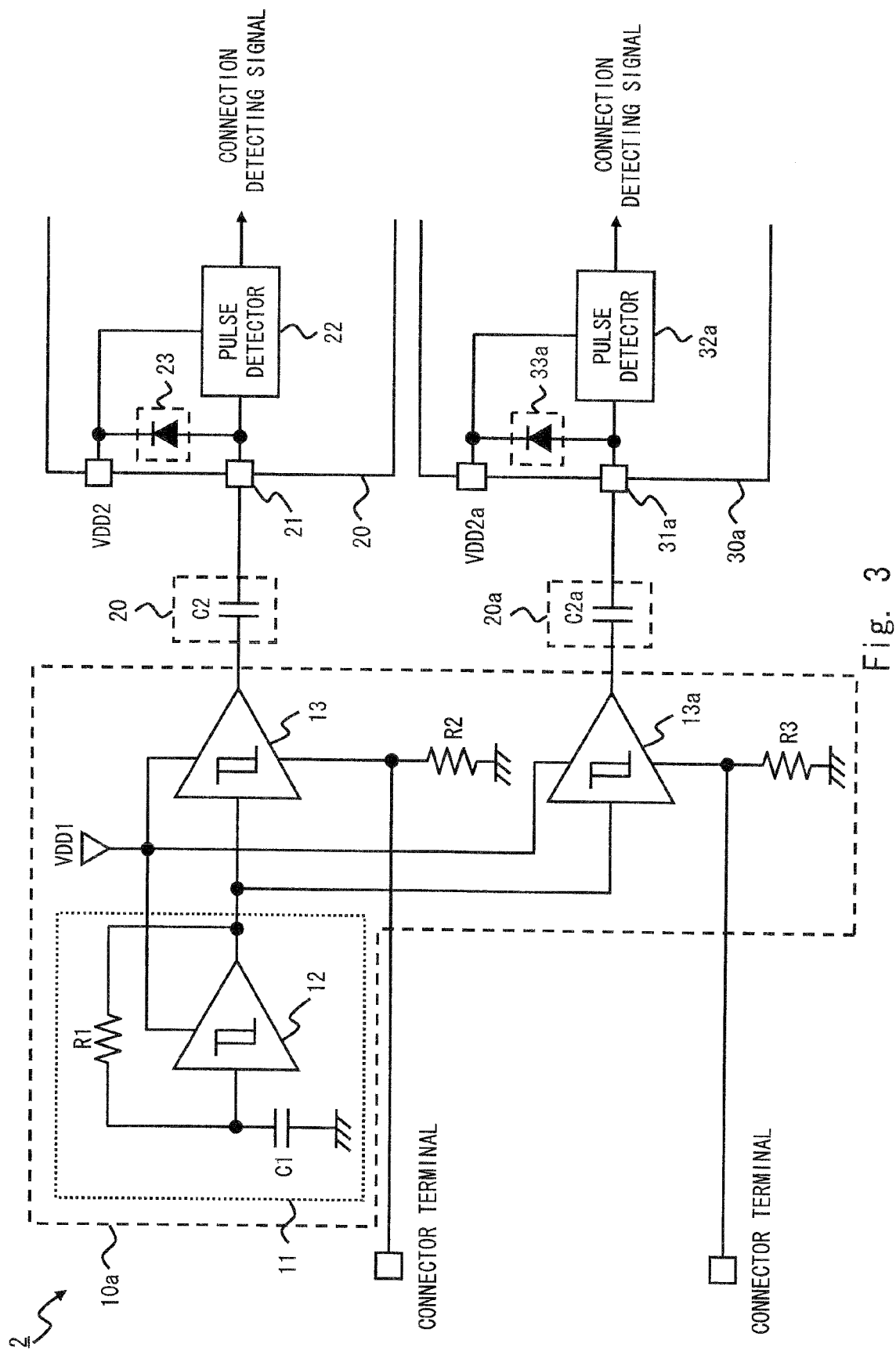
FIG. 3 is a circuit diagram of an interface circuit according to a second embodiment of the present invention.

A circuit diagram of an interface circuit 2 according to a second embodiment of the present invention is shown in FIG. 3. As shown in FIG. 3, in the interface circuit 2, a receiving circuit 30a and an AC coupling element 20a (indicated by a capacitor C2a in FIG. 3) are added to the interface circuit 1 in the first embodiment. Further, in an input level determination circuit 10a provided in place of the input level determination circuit 10, an output control circuit 13a is added to the input level determination circuit 10 in the first embodiment. To the output control circuit 13a, the input level determination signal output from the oscillating circuit 11 is input, and an output of the output control circuit 13a is connected to the receiving circuit 30a through the AC coupling element 20a. The output control circuit 13a is connected to a connector terminal different from that for the output control circuit 13. The output control circuit 13a controls a signal to be output based on a binary signal input through the connector terminal to which the output control circuit 13a is connected.

In the interface circuit 2 in the second embodiment, the AC coupling element 20a and the output control circuit 13a are added according to the added receiving circuit 30a. Further, to both of the output control circuits 13 and 13a, the input level determination signal output by the oscillating circuit 11 is input. Accordingly, in the interface circuit 2 in the second embodiment, even when the receiving circuit is added, it is not necessary to add the oscillating circuit 11. It means that, in the interface circuit 2, with respect to an increase in the number of receiving circuits, an increase in the circuit size of the input level determination circuit may be restrained.

Third Embodiment

Figure 4:
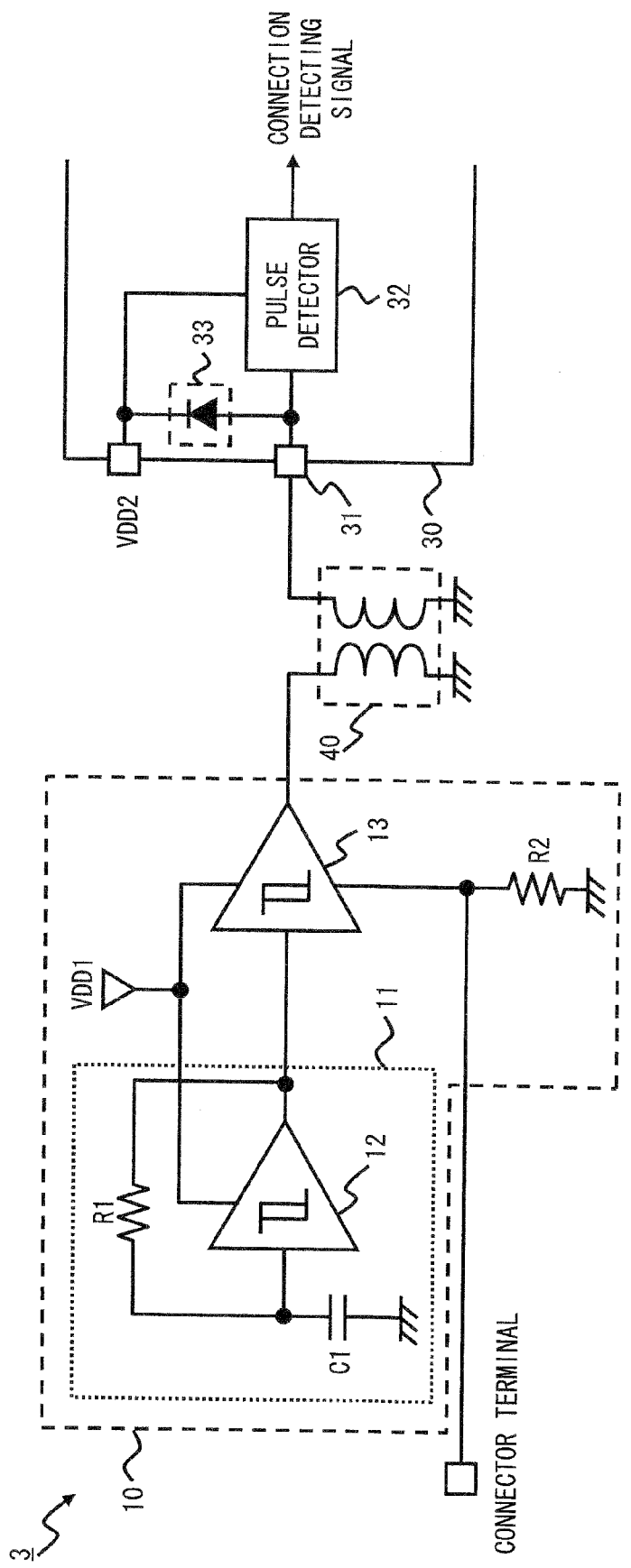
FIG. 4 is a circuit diagram of an interface circuit according to a third embodiment of the present invention.
Figure 5:
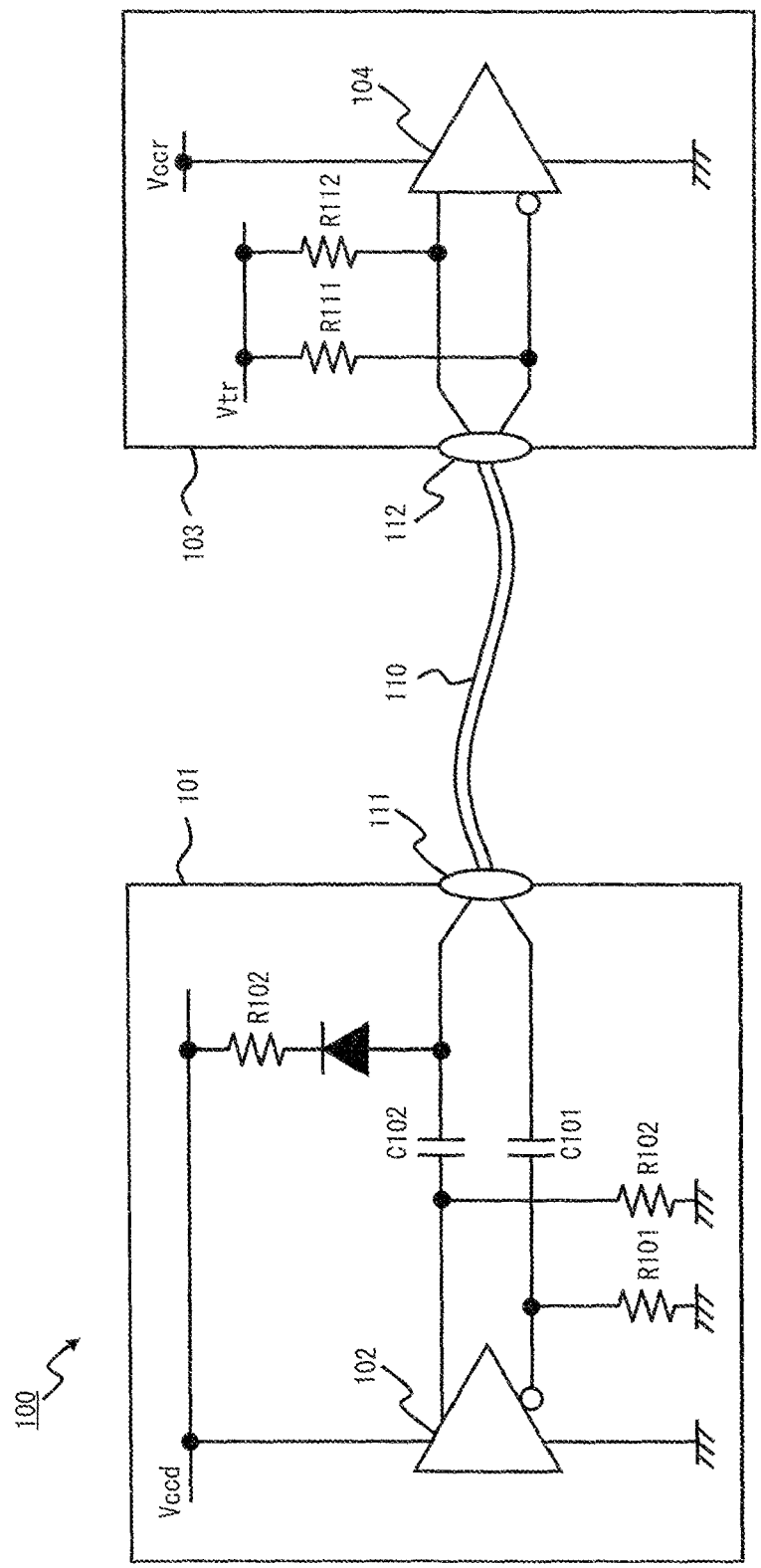
FIG. 5 is a circuit diagram of an interface circuit according to a related art.

A circuit diagram of an interface circuit 3 according to a third embodiment of the present invention is shown in FIG. 4.

As shown in FIG. 4, the interface circuit 3 includes an AC coupling element 40 in place of the AC coupling element 20 in the interface circuit 1 in the first embodiment. The AC coupling element 40 uses a transformer. The transformer blocks a DC component and transmits an AC component. Further, the transformer transforms the amplitude of an input signal into the amplitude of an output signal according to a turns ratio between two coils. As described above, the transformer, as well as the capacitor, may be employed as the AC coupling element.

It is apparent that the present invention is not limited to the above embodiments, but may be modified and changed without departing from the scope and spirit of the invention. For example, the oscillating circuit is not limited to the configuration in the embodiments described above. A ring oscillator, for example, may be employed as the oscillating circuit.

What is claimed is:

1. An interface circuit, comprising:
   a connector terminal configured to receive an input signal in which one of signal levels is substantially direct current;
   an oscillating circuit configured to generate and output an input level determination signal having a frequency higher than a frequency of the input signal;
   an output control circuit having a first enable terminal connected to a first power supply node and a second enable terminal receiving the input signal via the connector terminal and an input terminal connected to the oscillating circuit to control whether to output the input level determination signal or not, based on a signal level of the input signal;
   an AC coupling element coupled to the output control circuit to transmit the input level determination signal output from the output control circuit; and
   a receiving circuit coupled to the AC coupling element to receive the input level determination signal, the receiving circuit comprises a clamp circuit that limits an upper limit value of the input level determination signal and includes a protective diode connected between an input node of the receiving circuit and a power supply terminal,
   wherein the oscillating circuit continues to output the input level determination signal when the output control circuit stops outputting the input level determination signal.

2. The interface circuit according to claim 1, further comprising:
   another connector terminal configured to receive another input signal in which one of signal levels is substantially direct current; and
   another output control circuit coupled to the another connector terminal and the oscillating circuit to control whether to output the input level determination signal or not, based on a signal level of the another input signal,
   wherein the input terminal of the output control circuit via which the output control circuit receives the input level determination signal and another input terminal of the another output control circuit via which the another output control circuit receives the input determination signal are connected electrically in parallel regarding to an output terminal of the oscillating circuit via which the oscillating circuit outputs the input level determination signal.

3. The interface circuit according to claim 1, wherein the receiving circuit comprises a pulse detector that outputs a connection detecting signal based on presence of the input level determination signal.

4. The interface circuit according to claim 1, wherein the AC coupling element transmits an AC component of the input level determination signal to the receiving circuit through a capacitor.

5. The interface circuit according to claim 1, wherein the AC coupling element transmits an AC component of the input level determination signal to the receiving circuit through a transformer.

6. The interface circuit according to claim 1, wherein the input signal is a binary signal having a first logic level and a second logic level different from the first logic level, and a duration of the first logic level and a duration of the second logic level are not fixed.

7. The interface circuit according to claim 1, wherein the input signal indicates whether or not other device is connected to the interface circuit through a cable.

8. The interface circuit according to claim 1, wherein the input signal is an HPD signal defined in an HDMI standard or a DVI standard.

9. A interface circuit, comprising:
   a connector terminal configured to receive an input signal in which one of signal levels is substantially direct current;
   an oscillating circuit configured to generate and output an input level determination signal having a frequency higher than a frequency of the input signal via an output terminal;
   an output control circuit having an input terminal, and coupled to the connector terminal and the oscillating circuit to receive the input level determination signal via the input terminal and to control whether or not to output the input level determination signal, in accordance with a signal level of the input signal, to an AC coupling element which is to be coupled to the output control circuit and configured to transmit the input level determination signal a receiving circuit coupled to the AC coupling element to receive the input level determination signal to a receiving circuit comprising a clamp circuit that limits an upper limit value of the input level determination signal and includes a protective diode connected between an input node of the receiving circuit and a power supply terminal;
   another connector terminal configured to receive another input signal in which one of signal levels is substantially direct current; and
   another output control circuit having another input terminal, and coupled to the another connector terminal and the oscillating circuit to receive the input level determination signal via the another input terminal and control whether or not to output the input level determination signal, in accordance with a signal level of the another input signal, to another AC coupling element which is to be coupled to the another output control circuit and configured to transmit the input level determination signal,
   wherein the input terminal of the output control circuit and the another input terminal of the another output control circuit are connected electrically in parallel regarding to the output terminal of the oscillating circuit.

10. The interface circuit according to claim 9, further comprising:
   an AC coupling element coupled to the output control circuit to transmit the input level determination circuit output from the output control circuit.

* * * * *